(12) United States Patent
Riker et al.

(10) Patent No.: US 10,312,065 B2
(45) Date of Patent: Jun. 4, 2019

(54) PHYSICAL VAPOR DEPOSITION (PVD) PLASMA ENERGY CONTROL PER DYNAMIC MAGNETRON CONTROL

(71) Applicant: APPLIED MATERIALS, INC., Santa Clara, CA (US)

(72) Inventors: Martin Lee Riker, Milpitas, CA (US); Keith A. Miller, Mountain View, CA (US); Shreekant Gayaka, San Jose, CA (US); Carl R. Johnson, Tracy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 219 days.

(21) Appl. No.: 15/290,150

(22) Filed: Oct. 11, 2016

(65) Prior Publication Data

US 2018/0025895 A1 Jan. 25, 2018

Related U.S. Application Data

(60) Provisional application No. 62/364,822, filed on Jul. 20, 2016.

(51) Int. Cl.
*H01J 37/34* (2006.01)
*C23C 14/35* (2006.01)
(Continued)

(52) U.S. Cl.
CPC .......... *H01J 37/3476* (2013.01); *C23C 14/35* (2013.01); *C23C 14/541* (2013.01);
(Continued)

(58) Field of Classification Search
CPC .......... H01J 37/32027; H01J 37/32082; H01J 37/3266; H01J 37/32697; H01J 37/32715; H01J 37/3455; H01J 37/3476; H01J 2237/334; C23C 14/35; C23C 14/541; C23C 14/542; C23C 14/5806; H01L 21/2855; H01L 21/3065; H01L 22/26
USPC ............... 204/192.13, 298.08, 298.06, 298.2
See application file for complete search history.

(56) References Cited

U.S. PATENT DOCUMENTS 6,179,973 B1 1/2001 Lai et al.
6,497,796 B1 12/2002 Ashtiani et al.
(Continued)

FOREIGN PATENT DOCUMENTS

WO WO 2008-123987 A1 10/2008

OTHER PUBLICATIONS

International Search Report and Written Opinion dated Sep. 14, 2017 for PCT Application No. PCT/US2017/038679.

*Primary Examiner* — Rodney G McDonald
(74) *Attorney, Agent, or Firm* — Moser Taboada; Alan Taboada

(57) ABSTRACT

A method, apparatus and system for controlling the processing of a substrate within a process chamber are described herein. In some embodiments, a method of controlling a substrate process within a process chamber includes determining a position of a moveable magnetron in the process chamber relative to a reference location on a surface of the substrate and modulating a power parameter of at least one power supply affecting substrate processing based on the determined position of the magnetron to control, for example, at least one of a deposition rate or an etching rate of the substrate processing. In one embodiment, the modulated power parameter is a power set point of at least one of a direct current (DC) source power, a radio frequency (RF) bias power, a DC shield bias voltage, or an electromagnetic coil current of the at least one power supply.

20 Claims, 7 Drawing Sheets

(51) Int. Cl.
  *C23C 14/54* (2006.01)
  *H01J 37/32* (2006.01)
  *H01L 21/285* (2006.01)
  *H01L 21/3065* (2006.01)
  *H01L 21/66* (2006.01)

(52) U.S. Cl.
  CPC .... *H01J 37/32027* (2013.01); *H01J 37/3266* (2013.01); *H01J 37/32082* (2013.01); *H01J 37/32697* (2013.01); *H01J 37/32715* (2013.01); *H01J 37/3455* (2013.01); *H01L 21/2855* (2013.01); *H01L 21/3065* (2013.01); *H01L 22/26* (2013.01); *H01J 2237/334* (2013.01)

(56) References Cited

U.S. PATENT DOCUMENTS

| | | |
|---|---|---|
| 2002/0088711 A1 | 7/2002 | Lu et al. |
| 2003/0217914 A1* | 11/2003 | Miller ................ H01J 37/3408 204/192.12 |
| 2007/0056850 A1 | 3/2007 | Ye et al. |
| 2008/0083610 A1 | 4/2008 | Tang et al. |
| 2011/0311735 A1 | 12/2011 | Wang et al. |
| 2012/0103800 A1 | 5/2012 | Chang et al. |
| 2012/0111220 A1 | 5/2012 | King |
| 2012/0181166 A1 | 7/2012 | Luo et al. |
| 2014/0046475 A1 | 2/2014 | Lam et al. |

* cited by examiner

PHYSICAL VAPOR DEPOSITION (PVD) PLASMA ENERGY CONTROL PER DYNAMIC MAGNETRON CONTROL

CROSS-REFERENCE TO RELATED APPLICATIONS

This application claims benefit of U.S. provisional patent application Ser. No. 62/364,822, filed Jul. 20, 2016, which is herein incorporated by reference in its entirety.

FIELD

Embodiments of the present disclosure relate to plasma processing in semiconductor process chambers.

BACKGROUND

Reliably producing submicron and smaller features is one of the challenges for the next generation of very large scale integration (VLSI) and ultra large scale integration (ULSI) of semiconductor devices. However, as the miniaturization of circuit technology continues, the shrinking dimensions of interconnects in VLSI and ULSI technology have placed additional demands on the processing capabilities. For example, as circuit densities increase for next generation devices, the widths of interconnects, such as vias, trenches, contacts, gate structures and other features, as well as the dielectric materials therebetween, decrease while the thickness of the dielectric layers remains substantially constant, with the result of increasing the aspect ratios of the features.

Sputtering, also known in one application as physical vapor deposition (PVD), is a method of forming metallic features in integrated circuits. In such applications, sputtering deposits a material layer on a substrate. A source material, such as a target, is bombarded by ions strongly accelerated by an electric field. The bombardment ejects material from the target, and the material then deposits on the substrate. In other applications however, sputtering may also be used to etch a substrate. The inventors have observed that, during deposition and etching, ejected particles may travel in varying directions, rather than generally orthogonal to the substrate surface, undesirably resulting in non-uniform deposition and etching of the substrate. In addition, other factors, such as process conditions or process chamber design, can also undesirably affect processing uniformity on the substrate.

SUMMARY

Methods, apparatus, and systems for controlling processing of a substrate within a process chamber are described herein. In various embodiments in accordance with the present principles, a method of controlling the processing of a substrate within a process chamber that includes a moveable magnetron and at least one power supply, comprises determining a position of the magnetron relative to a reference location on a surface of the substrate and modulating a power parameter of at least one power supply affecting substrate processing based on the determined position of the magnetron. In one embodiment, the power parameter includes a power set point of at least one of a direct current (DC) source power, a radio frequency (RF) bias power, a DC shield bias voltage, or an electromagnetic coil current of the at least one power supply.

In some embodiments, the process chamber comprises a physical vapor deposition (PVD) chamber and the modulating controls a rate of material deposition at a location on the surface of the substrate corresponding to the determined position of the magnetron.

In some embodiments the process chamber comprises an etching chamber and the modulating controls a rate of material etching at a location on the surface of the substrate corresponding to the determined position of the magnetron In various embodiments in accordance with the present principles, an apparatus for controlling processing of a substrate within a process chamber including a moveable magnetron and at least one power supply includes a processor and a memory coupled to the processor. In such embodiments, the memory has stored therein instructions executable by the processor to configure the apparatus to determine a position of the magnetron relative to a reference location on a surface of the substrate and modulate a power parameter of the least one power supply based on the determined position of the magnetron.

In some embodiments, the apparatus receives position information of the magnetron from a two-axis driver included in the process chamber.

In various embodiments in accordance with the present principles, a substrate processing system includes a process chamber including an inner volume, a substrate support disposed within the inner volume to support a substrate, a target having a front face exposed to the inner volume, a movable magnetron disposed proximate a back side of the target opposite the front face and rotatable about a central axis of the substrate support and at least one power supply providing power to the process chamber. The substrate processing system further includes a controller comprising a processor and a memory coupled to the processor. In such embodiments, the memory has stored therein instructions executable by the processor to configure the controller to determine a position of the magnetron relative to a reference location on a surface of the substrate and modulate a power parameter of the least one power supply based on the determined position of the magnetron.

In some embodiments, the substrate processing system further includes a two-axis driver for controlling a movement of the magnetron and communicating position information of the magnetron to the controller.

Other and further embodiments in accordance with the present principles are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
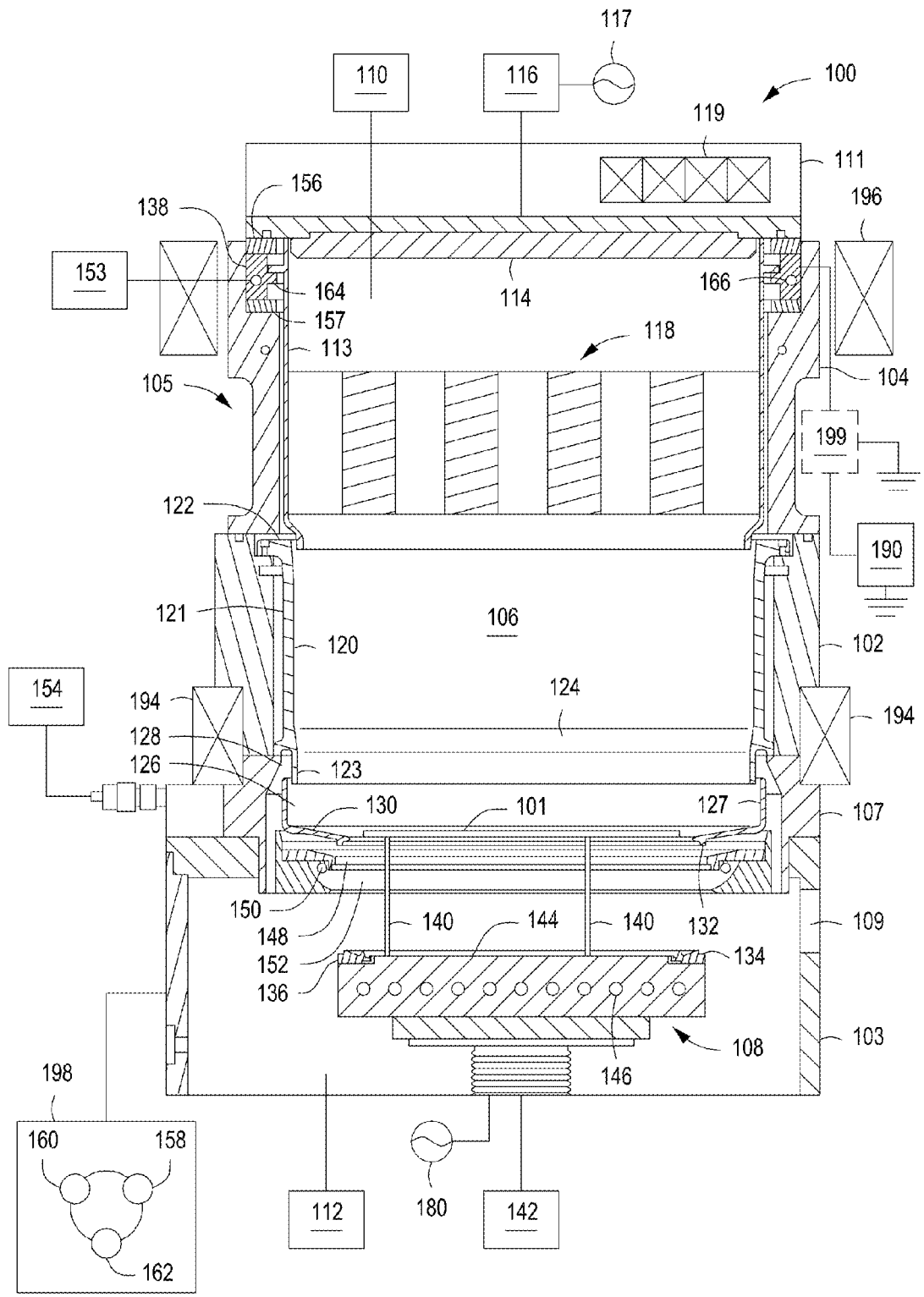
FIG. 1 depicts a schematic cross-sectional view of a physical vapor deposition (PVD) chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present principles relate to a high resolution control system that enables process control based on an angular and/or a radial position of a magnetron in real time. For example, the magnetron position and/or angle may be used as input parameters in control of the power supplies directly affecting the process, thus adding a new layer of control to the resulting deposited films or etched target. Embodiments of the present principles may advantageously reduce, control, or eliminate process rate non-uniformities, such as center-fast, center-slow, and left-right or asymmetrical skew on a substrate, that are induced in plasma process chambers. Skew generally refers to the difference in process results from one region of the substrate to another. By way of illustrative example, the process results may be the amount of material deposited upon a target surface of the substrate, as by a physical vapor deposition operation, or the amount of material removed from the substrate during an etching operation. The skew may be characterized by left vs. right differences, center vs. edge differences, top vs. bottom of a feature, or any combination of these. In some cases, the skew is related to, or otherwise caused by, the previous process chamber used to process the substrate in the process sequence. Additional contributors to skew include asymmetries in flow, pressure, temperature, and power delivery by the RF power applicator used to generate the plasma. Although embodiments of the present principles will be described primarily with respect to a PVD process, the disclosed embodiments should not be considered limiting. Embodiments of the present disclosure may be applied to deposition processes and etching processes.

FIG. 1 depicts an illustrative PVD chamber (process chamber 100), e.g., a sputter process chamber, suitable for sputter depositing materials on a substrate in accordance with embodiments of the present disclosure. Illustrative examples of suitable PVD chambers that may be adapted to benefit from the disclosure include the ALPS® Plus and SIP ENCORE® PVD process chambers, both commercially available from Applied Materials, Inc., Santa Clara, of California. Other processing chambers available from Applied Materials, Inc. as well as other manufacturers may also be adapted in accordance with the embodiments described herein.

The process chamber 100 has an upper sidewall 102, a lower sidewall 103, a ground adapter 104, and a lid assembly 111 defining a body 105 that encloses an interior volume 106 thereof. An adapter plate 107 may be disposed between the upper sidewall 102 and the lower sidewall 103. A substrate support, such as a pedestal 108, is disposed in the interior volume 106 of the process chamber 100. A substrate transfer port 109 is formed in the lower sidewall 103 for transferring substrates into and out of the interior volume 106.

In some embodiments, the process chamber 100 is configured to deposit, for example, titanium, aluminum oxide, aluminum, aluminum oxynitride, copper, tantalum, tantalum nitride, tantalum oxynitride, titanium oxynitride, tungsten, tungsten nitride, or other materials, on a substrate, such as the substrate 101.

A gas source 110 is coupled to the process chamber 100 to supply process gases into the interior volume 106. In some embodiments, process gases may include inert gases, non-reactive gases, and reactive gases, if necessary. Examples of process gases that may be provided by the gas source 110 include, but not limited to, argon gas (Ar), helium (He), neon gas (Ne), nitrogen gas ($N_2$), oxygen gas ($O_2$), and water ($H_2O$) vapor among others.

A pump 112 is coupled to the process chamber 100 in communication with the interior volume 106 to control the pressure of the interior volume 106 to any suitable pressure for a given process. In some embodiments, during deposition the pressure level of the process chamber 100 may be maintained at about 1 Torr or less. In some embodiments, the pressure level of the process chamber 100 may be maintained at about 500 mTorr or less during deposition. In some embodiments, the pressure level of the process chamber 100 may be maintained at about 1 mTorr and about 300 mTorr during deposition.

The ground adapter 104 may support a sputtering source 114, such as a target fabricated from a material to be sputter deposited on a substrate. In some embodiments, the sputtering source 114 may be fabricated from titanium (Ti) metal, tantalum metal (Ta), tungsten (W) metal, cobalt (Co), nickel (Ni), copper (Cu), aluminum (Al), alloys thereof, combinations thereof, or the like.

The sputtering source 114 may be coupled to a source assembly 116 comprising a power supply 117 for the sputtering source 114. In some embodiments, the power supply 117 may be an RF power supply. In some embodiments, the power supply 117 may alternatively be a DC power supply. In some embodiments, the power supply 117 may include both DC and RF power sources.

A magnetron assembly (magnetron 119) which includes set of rotatable magnets may be coupled adjacent to the sputtering source 114 which enhances efficient sputtering materials from the sputtering source 114 during processing. Examples of the magnetron assembly include an electromagnetic linear magnetron, a serpentine magnetron, a spiral magnetron, a double-digitated magnetron, a rectangularized spiral magnetron, among others. The magnetron assembly includes at least one motor for controlling the rotation of the magnets. In some embodiments, two motors are provided for controlling the rotation of the magnets. Rotary encoders, position sensors, or the like may be used to provide a signal representative of the angular position of the magnetron 119. The radial position of the magnetron 119 may be calculated from the angular position or may be determined using one or more encoders, position sensors, or the like.

In some embodiments, a first set of magnets 194 may be disposed between the adapter plate 107 and the upper sidewall 102 to assist generating a magnetic field to guide the metallic ions dislodged from the sputtering source 114. A second set of magnets 196 may be disposed adjacent to the ground adapter 104 to assist generating the magnetic field to guide dislodged materials from the sputtering source 114. The numbers of the magnets disposed around the process chamber 100 may be selected to control plasma dissociation and sputtering efficiency. The first and second sets of magnets 194, 196 may be electromagnets coupled to a power source for controlling the magnitude of the magnetic field generated by the electromagnets.

An RF power source 180 may be coupled to the process chamber 100 through the pedestal 108 to provide a bias power between the sputtering source 114 and the pedestal 108. In some embodiments, the RF power source 180 may have a frequency between about 400 Hz and about 60 MHz, such as about 13.56 MHz.

The process chamber 100 further includes an upper shield 113 and a lower shield 120. A collimator 118 is positioned in the interior volume 106 between the sputtering source 114 and the pedestal 108. The collimator 118 includes a plurality of apertures to direct gas and/or material flux within the interior volume 106. The collimator 118 is coupled to the upper shield 113 using any fixation means. In some embodiments, the collimator 118 may be formed integrally with the upper shield 113. The collimator 118 may be electrically biased to control ion flux to the substrate and neutral angular distribution at the substrate, as well as to increase the deposition rate due to the added DC bias. Electrically biasing the collimator results in reduced ion loss to the collimator to advantageously enable greater ion/neutral ratios at the substrate. Optionally, a switch 199 may be disposed between the upper shield 113 and the collimator power source 190 to selectively couple the upper shield 113 and collimator 118 to the collimator power source 190.

In some embodiments, the collimator 118 may be electrically biased in bipolar mode so as to control the direction of the ions passing through the collimator 118. For example, a controllable direct current (DC) or AC collimator power source 190 may be coupled to the collimator 118 to provide an alternating pulsed positive or negative voltage to the collimator 118 so as to bias the collimator 118. In some embodiments, the collimator power source 190 is a DC power source.

To facilitate applying bias to the collimator 118, the collimator 118 is electrically isolated from grounded chamber components such as the ground adapter 104. For example, in the embodiment depicted in FIG. 1, the collimator 118 is coupled to the upper shield 113, which in turn is coupled to the process tool adapter 138. The process tool adapter 138 may be made from suitable conductive materials compatible with processing conditions in the process chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113. In some embodiments, the mounting ring or shelf 164 is a continuous ring about the inner diameter of the process tool adapter 138 to facilitate more uniform thermal contact with the upper shield 113 mounted to the process tool adapter 138.

In some embodiments, a coolant channel 166 may be provided in the process tool adapter 138 to facilitate flowing a coolant through the process tool adapter 138 to remove heat generated during processing. For example, the coolant channel 166 may be coupled to a coolant source 153 to provide a suitable coolant, such as water. The coolant channel 166 advantageously removes heat from the process tool (e.g., collimator 118) that is not readily transferred to other cooled chamber components, such as the ground adapter 104. For example, the insulator rings 156, 157 disposed between the process tool adapter 138 and the ground adapter 104 are typically made from materials with poor thermal conductivity. Thus, the insulator rings 156, 157 reduce the rate of heat transfer from the collimator 118 to the ground adapter 104 and the process tool adapter 138 advantageously maintains or increases the rate of cooling of the collimator 118. In addition to the coolant channel 166 provided in the process tool adapter 138, the ground adapter 104 may also include a coolant channel to further facilitate removing heat generated during processing.

A radially inwardly extending ledge (e.g., the mounting ring, or shelf 164) is provided to support the upper shield 113 within the central opening within the interior volume 106 of the process chamber 100. In some embodiments the shelf 164 is disposed in a location proximate the coolant channel 166 to facilitate maximizing the heat transfer from the collimator 118 to the coolant flowing in the coolant channel 166 during use.

In some embodiments, the lower shield 120 may be provided in proximity to the collimator 118 and interior of the ground adapter 104 or the upper sidewall 102. The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123.

A shield ring 126 may be disposed in the process chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

In some embodiments, the shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the pedestal 108. The recess 134 may be a circular groove formed in the edge ring 136. The engagement of the protrusion 132 and the recess 134 centers the shield ring 126 with respect to the longitudinal axis of the pedestal 108.

The substrate 101 (shown supported on lift pins 140) is centered relative to the longitudinal axis of the pedestal 108 by coordinated positioning calibration between the pedestal 108 and a robot blade (not shown). Thus, the substrate 101 may be centered within the process chamber 100 and the shield ring 126 may be centered radially about the substrate 101 during processing.

In operation, a robot blade (not shown) having the substrate 101 disposed thereon is extended through the substrate transfer port 109. The pedestal 108 may be lowered to allow the substrate 101 to be transferred to the lift pins 140 extending from the pedestal 108. Lifting and lowering of the pedestal 108 and/or the lift pins 140 may be controlled by a drive 142 coupled to the pedestal 108. The substrate 101 may be lowered onto a substrate receiving surface 144 of the pedestal 108. With the substrate 101 positioned on the substrate receiving surface 144 of the pedestal 108, sputter deposition may be performed on the substrate 101. The edge ring 136 may be electrically insulated from the substrate 101 during processing. Therefore, the substrate receiving surface 144 may have a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the pedestal 108.

In some processes, after sputter deposition, the substrate 101 may be elevated utilizing the lift pins 140 to a position that is spaced away from the pedestal 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. The adapter plate 107 may be coupled to the coolant source 153 or 154 to control the temperature of the adapter plate 107 during heating.

After controlling the substrate 101 to a predetermined temperature, the substrate 101 is lowered to a position on the substrate receiving surface 144 of the pedestal 108. The substrate 101 may be rapidly cooled utilizing the thermal control channels 146 in the pedestal 108 via conduction. The temperature of the substrate 101 may be ramped down from the first temperature to a second temperature in a matter of seconds to about a minute. The substrate 101 may be removed from the process chamber 100 through the substrate transfer port 109 for further processing. The substrate 101 may be maintained at a predetermined temperature range, such as less than 250 degrees Celsius.

A controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the process chamber 100 and controlling ion bombardment of the sputtering source 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 198 that controls the process chamber 100 such that the processes, including the processes disclosed below, are performed in accordance with embodiments of the present disclosure. The software routines may also be stored and/or executed by a second controller (not shown) that is located remotely from the process chamber 100.

In some embodiments, the process chamber 100 is wired for ~1 ms or less network latency for digital communications to facilitate control of the process in substantially real time. As used herein, "real time" means within about 1 ms or less.

During processing, material is sputtered from the sputtering source 114 and deposited on the surface of the substrate 101. The sputtering source 114 and the pedestal 108 are biased relative to each other by the power supply 117 or the RF power source 180 to maintain a plasma formed from the process gases supplied by the gas source 110. The DC power applied to the collimator 118 also assists with constant or pulsed power, controlling ratio of the ions and neutrals passing through the collimator 118, advantageously enhancing the trench sidewall and bottom fill-up capability. The ions from the plasma are accelerated toward and strike the sputtering source 114, causing target material to be dislodged from the sputtering source 114. The dislodged target material, and in some embodiments one or more elements from the process gases, forms a layer on the substrate 101.

In operation and with reference to FIG. 1, the magnetron 119 is positioned behind the sputtering source 114 to enhance the dislodging of target material in an area of the sputtering source 114 proximate the magnetron 119. The inventors determined that the positional information of the magnetron 119 may be used to control a deposition or etching process to, for example, correct for uniformity errors in accordance with the principles described herein.

The process chamber 100 of FIG. 1 is an illustrative example of a process chamber and is not limiting of the scope of the disclosure. In some embodiments in accordance with the present principles, a process chamber can include only some of the components of the process chamber 100 of FIG. 1. For example, in the process chamber 100 of FIG. 1, the lamps 150, the reflector rings 148 and the collimator 118 can be considered optional components for some processes performed in the process chamber 100 of FIG. 1 to which embodiments in accordance with the present principles may be applied. In addition, although the process chamber 100 of FIG. 1 is depicted as a PVD chamber to be used for a material deposition process, in some embodiments, the inventive processes described herein can be applied to a sputter etching process in which the substrate to be etched may be considered the 'target'.

Figure 2:
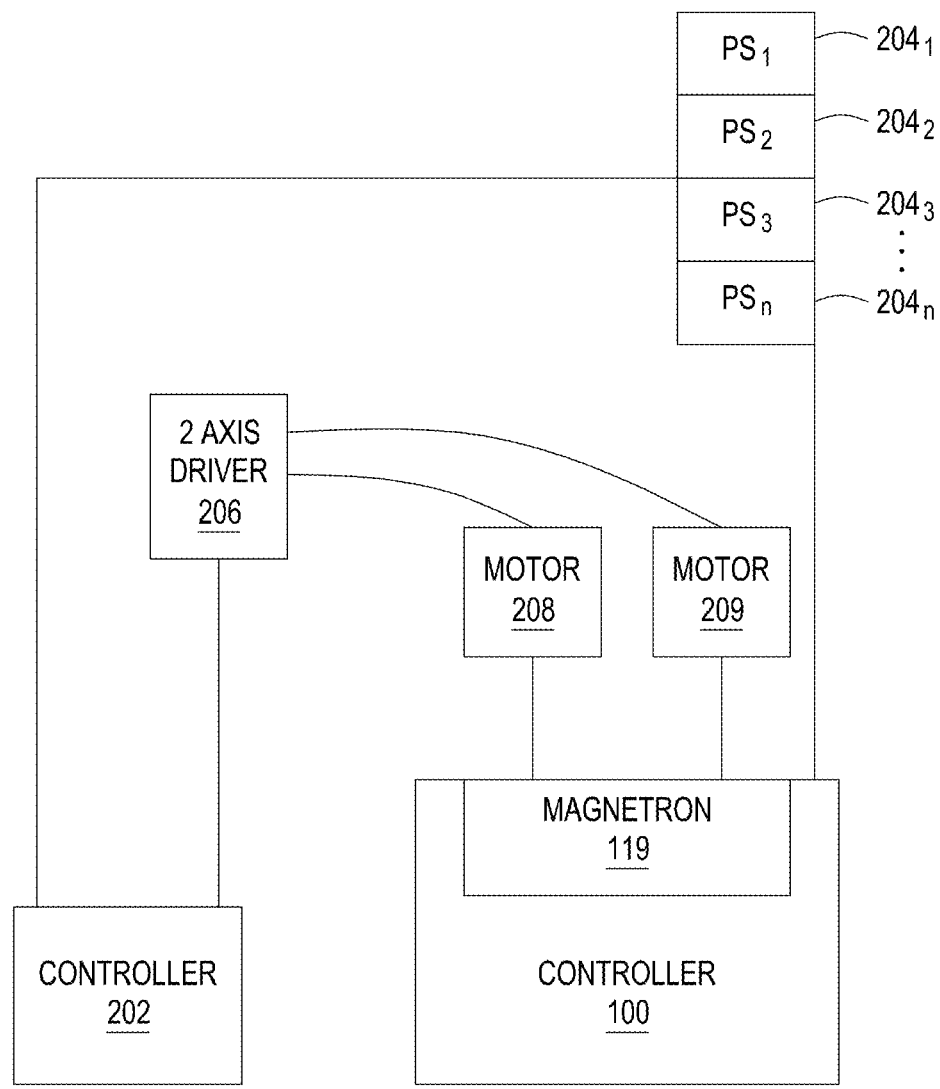
FIG. 2 depicts a high level block diagram of a system for controlling process uniformity on a substrate within a process chamber in accordance with an embodiment of the present principles.

FIG. 2 depicts a high level block diagram of a system 200 for controlling process uniformity on a substrate within, for example a physical vapor deposition (PVD) chamber or an etching chamber, in accordance with an embodiment of the present principles. The system 200 of FIG. 2 illustratively comprises a controller 202 and a process chamber, such as the PVD process chamber 100 of FIG. 1 or, alternatively, an etching chamber (not shown). In various embodiments, the controller 202 of FIG. 2 can comprise the controller 198 of FIG. 1 or, in alternate embodiments, the controller 202 can be a second controller as described above with reference to controller 198 of FIG. 1. FIG. 2 further illustratively depicts a representation of the power supplies $204_1$-$204_n$, collectively power supplies 204, associated with the various components of the process chamber 100. Such power supplies can include DC or RF source power supply (e.g., power supply 117), RF bias power supply (e.g., RF power source 180), AC or DC shield bias voltage supply (e.g., collimator power source 190), electromagnetic coil current supply (e.g., current supplied to first and/or second magnets 194, 196), or any other power supplies affecting substrate processing.

The system 200 of FIG. 2 further illustratively includes a two-axis driver 206 for controlling respective motors 208, 209 used to position the magnetron 119 of the process chamber 100. In FIG. 2, the power supplies 204, the two-axis driver 206 and the respective motors 208, 209 are depicted as components separate from the process chamber 100, however, in alternate embodiments in accordance with the present principles, the power supplies 204, the two-axis driver 206 and the respective motors 208, 209 may comprise integrated components of the process chamber 100.

Figure 3:
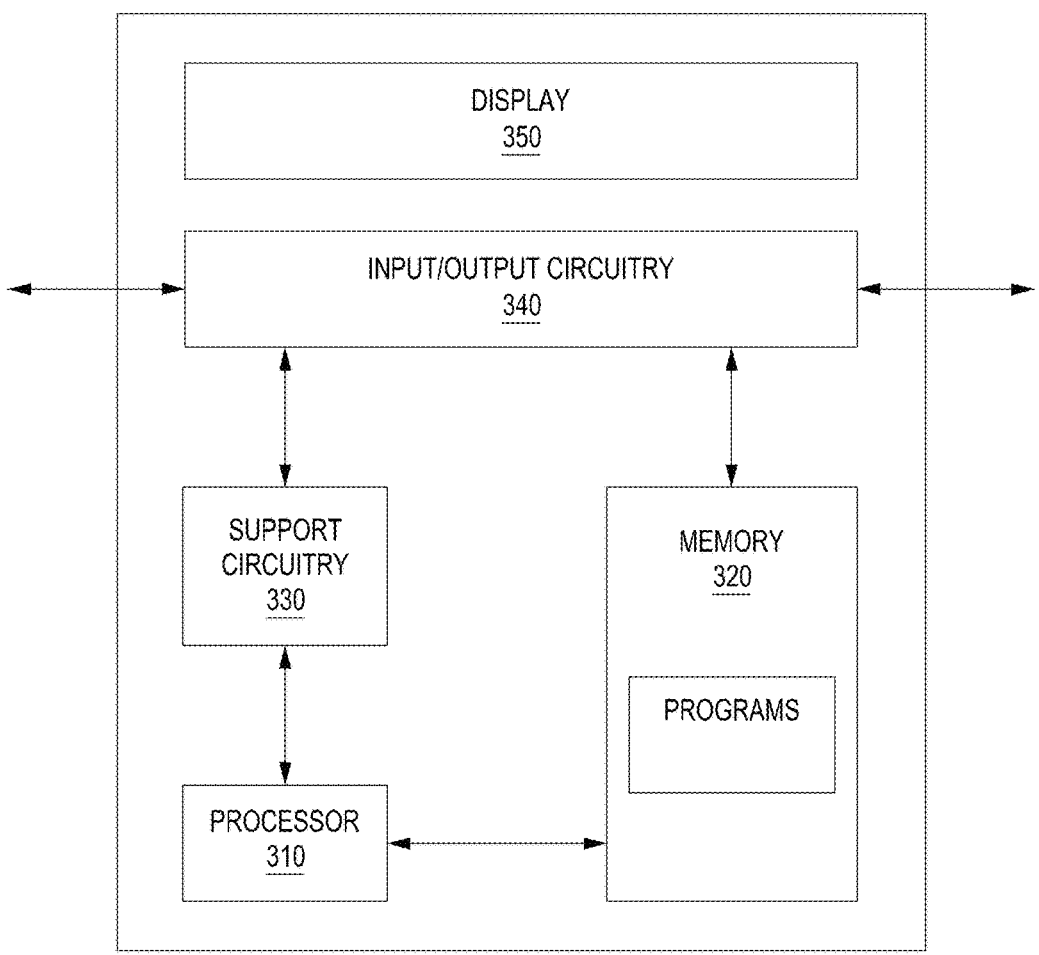
FIG. 3 depicts a high level block diagram of a controller suitable for use in the system of FIG. 2 in accordance with an embodiment of the present principles.

FIG. 3 depicts a high level block diagram of a controller 202 suitable for use in the system 200 of FIG. 2 in accordance with an embodiment of the present principles. The controller 202 of FIG. 3 comprises a processor 310 as well as a memory 320 for storing power control function types, such as functional curves, control programs, buffer pools and the like. The processor 310 cooperates with support circuitry 330 such as power supplies, clock circuits, cache memory and the like as well as circuits that assist in executing the software routines/programs stored in the memory 320. As such, some of the process steps discussed herein as software processes may be implemented within hardware, for example, as circuitry that cooperates with the processor 310 to perform various steps. The controller 202 also contains input-output circuitry 340 that forms an interface between the various functional elements communicating with the controller 202. As depicted in the embodiment of FIG. 3, the controller 202 can further include a display 350. The display 350 of the controller 202 may be used to present to a user, functional curves to be applied to power supplies affecting the deposition process, results of a deposition process having a functional curve applied in accordance with the teachings herein and the like.

Although the controller 202 of FIG. 3 is depicted as a general purpose computer, the controller 202 is programmed to perform various specialized control functions in accordance with the present principles and embodiments of the controller 202 can be implemented in hardware, for example, as an application specified integrated circuit (ASIC). As such, the process steps described herein are intended to be broadly interpreted as being equivalently performed by software, hardware, or a combination thereof.

In various embodiments in accordance with the present principles, a substrate is processed in a suitable process chamber (such as the PVD process chamber 100 of FIG. 1) to deposit material on the substrate. In such embodiments, the deposition rate on a surface of the substrate is measured to determine a deposition profile for the deposition process on the surface of the substrate. If any areas of undesired deposition (e.g., non-uniform) deposition are detected, a location of the undesired (e.g., non-uniform) deposition on the surface of the substrate and a rate (amount) of the undesired (e.g., non-uniform) depositions are determined. In some embodiments, a substrate is processed in a suitable process chamber (such as the PVD process chamber 100 of FIG. 1) to etch or remove material from the substrate. In such embodiments, an etching rate on a surface of the substrate is measured to determine an etching profile for the etching process on the surface of the substrate. Similarly, if any areas of undesired (e.g., non-uniform) etching are detected, a location of the undesired (e.g., non-uniform) etching on the surface of the substrate and a rate (amount) of the undesired (e.g., non-uniform) etching are determined. The profile information is communicated to the controller 202.

In some embodiments, the deposition rate on a surface of substrate being processed may be measured by resistance measurement and/or by x-ray florescence (XRF). In alternate embodiments in accordance with the present principles directed to an etching process, a substrate is measured, for example using XRF, before and after an etch process to detect how much material is removed from the substrate surface. Although specific examples are provided herein for measuring a deposition rate and an etch rate, the examples should not be considered as limiting. In alternate embodiments in accordance with the present principles, any known or not yet know methods or means for measuring/determining a deposition rate and an etch rate can be implemented in accordance with the present principles.

In various embodiments in accordance with the present principles, the controller 202 determines positions of the magnetron 119 relative to reference locations on a surface of a substrate to be processed. In one embodiment in accordance with the present principles, a position of the magnetron 119 relative to a surface of a substrate may be determined by the controller 202 using motor encoder information provided to the controller 202 by the two-axis driver 206. In some embodiments, home flags may establish a zero angular position for the magnetron with respect to a surface of a substrate being processed and may detect that angular position when the magnet passes the home flag sensor (e.g., once per revolution). In alternate embodiments, information regarding positions of the magnetron relative to reference locations on a surface of a substrate may be retrieved from a memory 320 of the controller 202, having been previously determined and stored in the memory 320 of the controller 202.

In accordance with the present principles, a power parameter, such as a power set point (or when referring to multiple locations, a power profile), of a power supply affecting substrate processing is modulated to control a deposition or etching rate at a location on the surface of the substrate based on a position of a magnetron. With reference to the process chamber 100 of FIG. 1, in some embodiments such power parameters of power supplies to be modulated can illustratively include power set points of a DC or RF source power (e.g., power supply 117), RF bias power (e.g., RF power source 180), AC or DC shield bias voltage (e.g., collimator power source 190), electromagnetic coil current (e.g., current supplied to first and/or second magnets 194, 196), or any other power supplies affecting the substrate processing. In one embodiment in accordance with the present principles, the power set point of a power supply may refer to an amount of power to be supplied by that power supply at a specific time during the processing of a substrate or an amount of power to be supplied by that power supply at a specific location on the surface of a substrate. As such, in embodiments in accordance with the present principles, an amount of power to be provided by a power supply may be modulated (e.g., increased or decreased) as described herein to control a deposition rate or etching rate at a location on the surface of the substrate based on a position of the magnetron.

For example, in various embodiments in accordance with the present principles, a deposition rate and/or etching rate is controlled to correct for areas on the surface of the substrate having non-uniform deposition or etching rates. Using information regarding locations on the surface of the substrate which contain non-uniform depositions or etching, which can be determined using previously determined deposition and etching profiles, and information regarding positions of the magnetron 119 relative to reference locations on a surface of a substrate, the controller 202 may communicate a signal to modulate a power profile of one or more power supplies, such as the power supplies 204, based on an angular and/or radial position of the magnetron to correct the areas of the non-uniform processing.

Figure 4A:
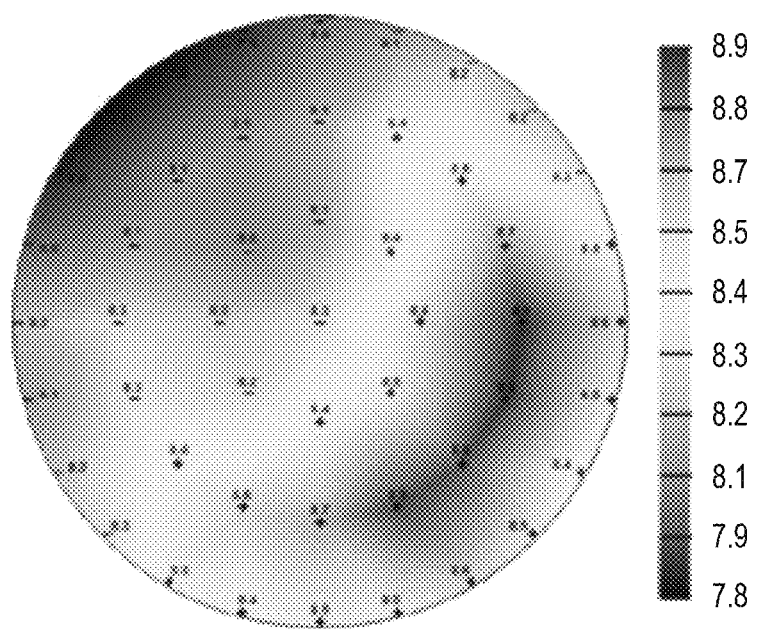
FIG. 4A depicts an off-axis deposition rate measurement resulting from a deposition process.
Figure 4B:
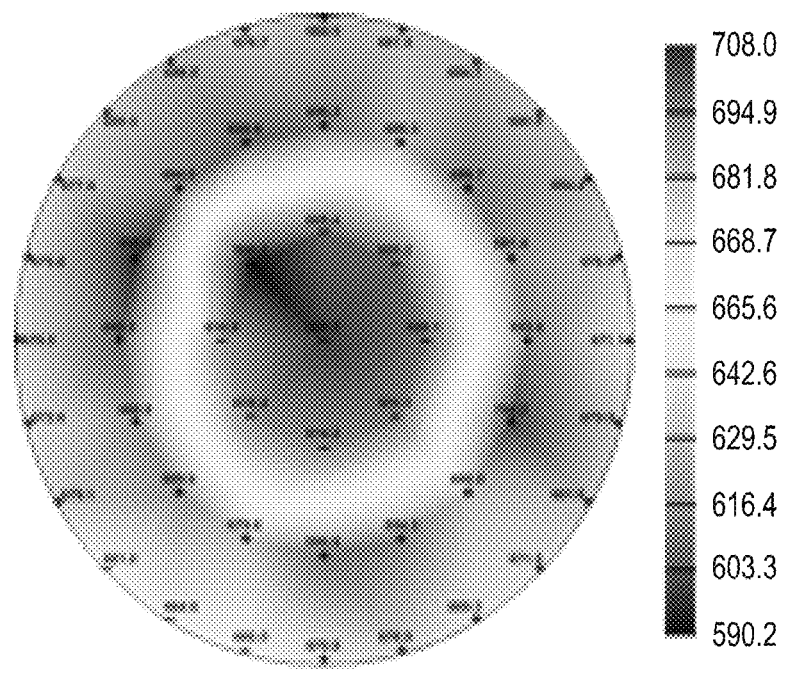
FIG. 4B depicts a deposition rate measurement of an axial film deposition process in which an outer portion of the substrate exhibits a heavier deposition rate than a center portion of the substrate.

For example, FIGS. 4A and 4B depict pictorial representations of deposition rate measurements resulting from the application of a non-uniform deposition process to a surface of a substrate. FIGS. 4A and 4B include a deposition rate scale for reference. More specifically, FIG. 4A depicts an off-axis deposition rate measurement resulting from a deposition process. As depicted in FIG. 4A, one quadrant on the surface of the substrate exhibits a heavier deposition rate than the other quadrants on the surface of the substrate.

In one embodiment in accordance with the present principles, the off-axis deposition rate process depicted in FIG. 4A may be corrected by controlling power profiles of one or more power supplies 204 based upon an angular position of the magnetron 119. For example, power supplies that impact substrate processing, such as power supplies 204, are modulated based upon an angular position of the magnetron 119 to thicken areas of thinner deposition and/or thin the areas of thicker deposition in locations on the surface of the substrate relative to the angular position of the magnetron. Such modulation may include increasing or decreasing the power profile of one or more of the power supplies 204 to respectively thicken areas of thinner deposition and/or thin the areas of thicker deposition by adjusting a deposition rate of the target material.

FIG. 4B depicts a deposition rate measurement of an axial film deposition process in which an outer portion of the substrate exhibits a heavier deposition rate than a center portion of the substrate. In an alternate embodiment in accordance with the present principles, the axial film deposition having thickness non-uniformity as measured on a substrate from center to edge, as depicted in FIG. 4B, may be corrected by controlling power inputs based upon the radial position of the magnetron. In such an embodiment, power supplies that impact substrate processing are modulated based upon a radial position of the magnetron 119 to yield greater deposition of target material in thin deposition areas and/or less deposition of target material in thick deposition areas on the surface of the substrate.

In various embodiments in accordance with the present principles, increasing a power profile of a power supply increases a deposition rate of target material on a substrate at a location on the surface of the substrate relative to the position of the magnetron. Conversely, decreasing a power profile of a power supply decreases a deposition rate of target material on a substrate at a location on the surface of the substrate relative to the position of the magnetron. In some embodiments, increasing a power profile of a power supply decreases a deposition rate of target material on a substrate at a location on the surface of the substrate relative to the position of the magnetron and decreasing a power profile of a power supply increases a deposition rate of target material on a substrate at a location on the surface of the substrate relative to the position of the magnetron.

In accordance with the present principles, a location on a surface of a substrate on which target material is being deposited may be identified using a position of the magnetron 119. As such, in accordance with embodiments of the present principles, a determination may be made when to adjust a power profile of one or more power supplies 204 to adjust a rate of material deposition at a corresponding location on the surface of a substrate being processed, which may be used to correct for non-uniform deposition.

The above described embodiments are not mutually exclusive. In various embodiments in accordance with the present principles, combinations of the above described embodiments are also possible. For example, a deposition process with axial non-uniformity combined with off-axis non-uniformity may be adjusted by controlling power inputs based upon both radial and angular positions of the magnetron. In addition, although the embodiments illustrated in FIGS. 4A and 4B are described with respect to a non-uniform deposition process, in alternate embodiments in accordance with the present principles, the same process can be applied to a non-uniform etching process. In such embodiments directed to a non-uniform etching process, locations on a surface of a substrate having non-uniform etching are measured and identified as described above. The non-uniform etching process may be corrected by controlling the power profiles of one or more power supplies based upon an angular or radial position of the magnetron 119. For example, power supplies that impact substrate processing, such as power supplies 204, may be modulated based upon an angular or radial position of the magnetron 119 to correct for non-uniform etching in locations on the surface of the substrate relative to the angular or radial positions of the magnetron 119. Such modulation may include increasing or decreasing the power profile of one or more of the power supplies 204 to alter the etching rate in the respective areas.

Figure 5A:
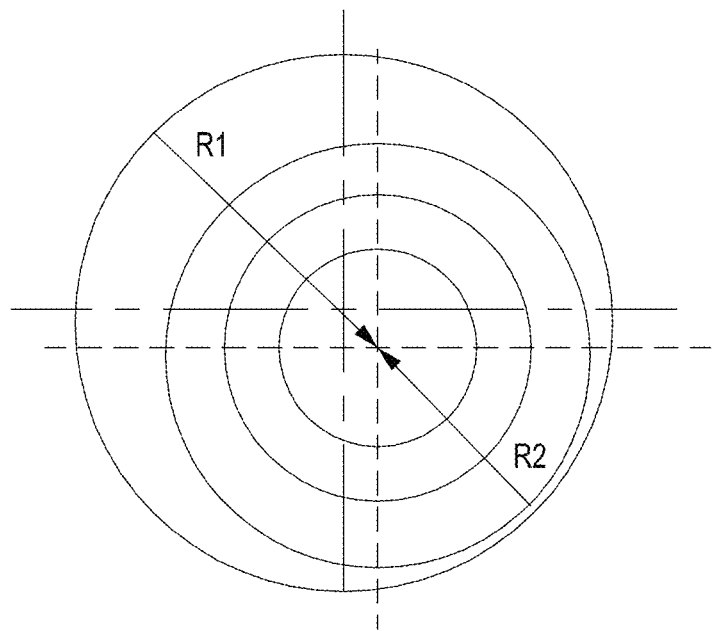
FIG. 5A depicts a graphical representation of a deposition of target material on a substrate resulting from a non-uniform deposition process.
Figure 5B:
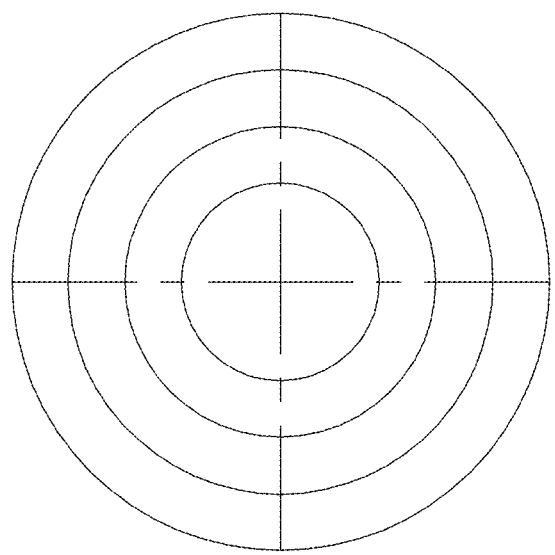
FIG. 5B depicts a graphical representation of a correction of the non-uniform deposition process of FIG. 5A corrected in accordance with an embodiment of the present principles.

FIG. 5A depicts a graphical representation of a deposition of target material on a substrate resulting from a non-uniform deposition process. As depicted in FIG. 5A, the deposition process has resulted in off-center depositing of target material on a substrate. In various embodiments in accordance with the present principles, to correct for such off-center deposition process, a first power set point, for example a first power level of an AC wafer bias, may be set at a first radial position, R1, as depicted in FIG. 5A, which may be identified using a radial position of the magnetron, and a second power set point, for example a second power level of an AC wafer bias, may be set at a second radial position, R2, which again may be identified using a radial position of the magnetron. In one embodiment in accordance with the present principles, the power level of the AC wafer bias may then be scaled linearly between R1 and R2. In alternate embodiments in accordance with the present principles, scaling between the power levels at R1 and R2 may be performed according to quadratic, cubic or other mathematical functions dependent on, for example, the condition of the non-uniform deposition in the area between R1 and R2. As a result of the above described power adjustment process, which is dependent on a radial position of the magnetron in accordance with embodiments of the present principles, the deposition process on the substrate would be centered as depicted in FIG. 5B.

Referring back to FIG. 5A, in alternate embodiments in accordance with the present principles, an off-center deposition process may be corrected based on an angle of the magnetron. In such embodiments, the center of the offset may be defined by angle and distance from a substrate center. The power set point may then be scaled according to the distance from the center of the offset. For example, a first power setting may be provided at the radius, R1, corresponding to a lowest deposition rate, and a second power setting may be provided at the radius, R2, corresponding to a highest deposition rate. The power setting may then be linearly or otherwise scaled between R1 and R2. The result of the above process, in accordance with embodiments of the present principles, is a centering of the deposition process on the substrate as depicted in FIG. 5B.

Although embodiments of the present principles are described above with respect to modulating a power profile of at least one power supply to control deposition and etching rates on a surface of a substrate to correct for non-uniform substrate processing (e.g., non-uniform deposition and etching), in alternate embodiments in accordance with the present principles, a power profile of at least one power supply may be modulated to control deposition and etching rates on a surface of a substrate to produce substantially any deposition and/or etching profile on a surface of a substrate. For example, in some applications of substrate processing, non-uniform depositions or etchings are an intended result of substrate processing, for example, to compensate for a prior or subsequent process that is known to be non-uniform. As such, embodiments in accordance with the present principles can be implemented to produce such non-uniform deposition and etching profiles.

In accordance with various embodiments of the present principles, various function types or shapes (e.g., linear, curved, quadratic, sinusoidal, or the like) may be implemented to adjust a power profile of one or more power supplies based on an angular or radial position of the magnetron. In one embodiment of the present principles, the function types or shapes are applied to set points of one or more power supplies to obtain a percentage change in the set points of the one or more power supplies that impact substrate processing. The change in the set points of the power supplies in accordance with embodiments of the present principles is used to adjust a yield (deposition rate, etching rate) of a substrate process across a surface of a substrate based on a position of the magnetron. Such function types may be applied to only some or to all of the power supply set points and may be the same or different as between any two power supplies.

Figure 6A:
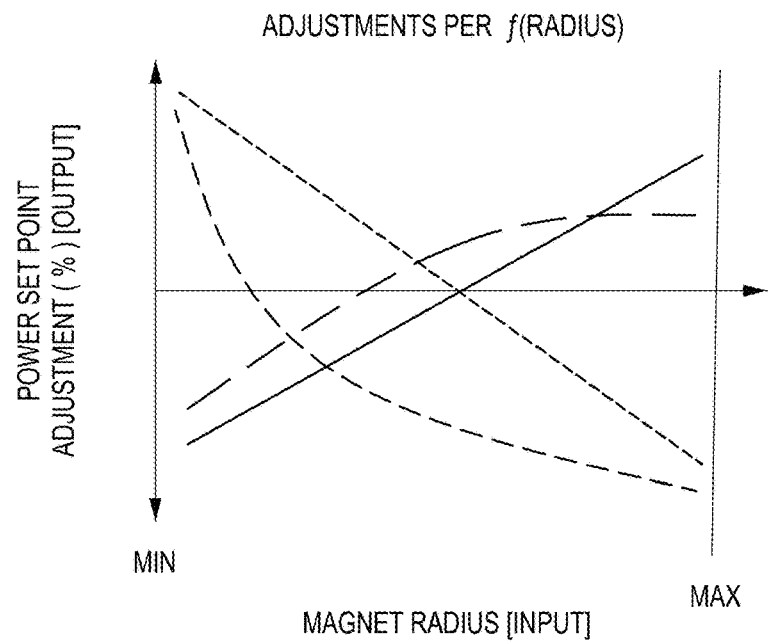
FIG. 6A depicts a graphical representation of exemplary functional curves that can be used to adjust a power set point of a power supply based on a radial position of the magnetron of a process chamber in accordance with an embodiment of the present principles.
Figure 6B:
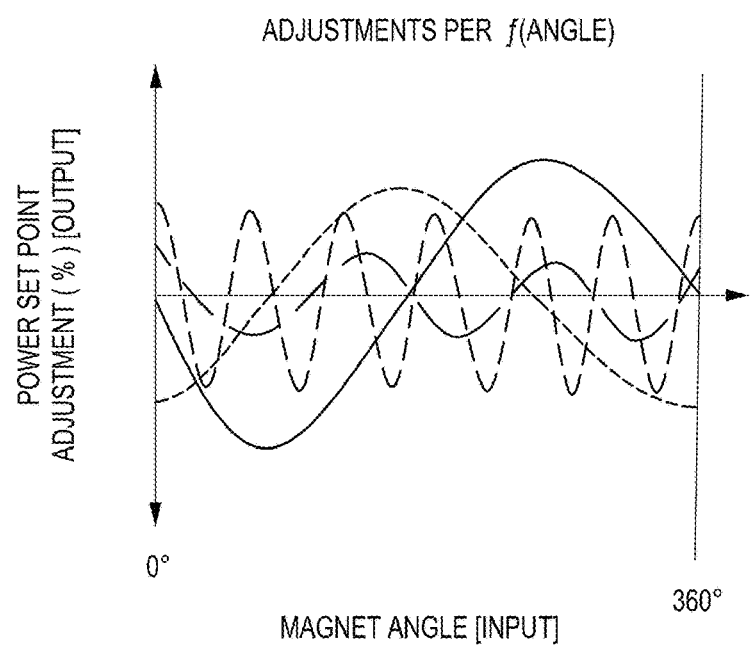
FIG. 6B depicts a graphical representation of exemplary functional curves that can be used to adjust a power set point of a power supply based on an angular position of the magnetron of a process chamber in accordance with an embodiment of the present principles.

For example, FIG. 6A depicts a graphical representation of exemplary functional curves that may be used to adjust a power set point of a power supply based on a radial position of the magnetron 119. FIG. 6B depicts a graphical representation of exemplary function curves that may be used to adjust a power set point of a power supply based on an angular position of the magnetron 119. As depicted in FIGS. 6A and 6B, in accordance with embodiments of the present principles, functional curves may be determined to be used, for example, by a controller, to adjust power set points of a power supply based on an angular or radial position of the magnetron to adjust deposition rates and or etching rates of target material on a surface of a substrate. In various embodiments in accordance with the present principles, the power set points of such functional curves can be determined using an iterative process described in further detail below. FIG. 6A is illustratively presented as a graph of power set point versus magnetron radius and FIG. 6B is illustratively presented as a graph of power set point versus magnetron angle.

In accordance with various embodiments of the present principles, an amount of adjustment to be made to set points of a power supply to control a rate of deposition/etching at a location on a surface of a substrate may be determined based on an amount of change to be made in a deposition rate or an etching rate at respective reference locations on the surface of the substrate and may be determined using an iterative process. In one embodiment, a position of the magnetron 119 is tracked by, for example the controller 202, until the magnetron 119 reaches a position corresponding to a location on the surface of the substrate at which an adjustment to the deposition rate or etch rate of target material is to be made. In some embodiments, the determination of where on the surface of the substrate an adjustment to the deposition rate or etch rate of target material is to be achieved may be made using a deposition rate profile or etching rate profile, determined as described above. When the position of the magnetron 119 corresponds to a location on the surface of the substrate at which an adjustment to the deposition rate or etch rate of target material is to be made, the controller 202 communicates a signal to at least one power supply 204 to modulate at least one set point of a power profile of at least one of the one or more power supplies to cause a change in the deposition rate/etching rate of the target material at the location on the surface of the substrate which corresponds to the position of the magnetron 119.

A measurement of the deposition rate/etching rate at a location on the surface of the substrate which corresponds to the location of the magnetron is taken to determine if the change in the deposition rate/etching rate was altered in an intended direction by the change made to the power profile of the one or more power supplies 204. If the deposition rate/etching rate was improved to an acceptable level, no further change is made to the power profile of the one or more power supplies. In one embodiment of the present principles, a power set point communicated to the one or more power supplies which resulted in the acceptable deposition rate/etching rate is saved by, for example the controller 202, as a point on a functional curve, such as the curves depicted in FIGS. 6A and 6B, for a corresponding position of the magnetron.

If the initial change in the power profile of the one or more power supplies improved the deposition rate/etching rate at the location on the surface of the substrate corresponding to the location of the magnetron, however a determination is made from a subsequent deposition rate/etching rate measurement that a greater change needs to be made, a greater adjustment is made to the power profile of the one or more power supplies in the same direction (e.g., polarity) as the previous, initial change. Another measurement of the deposition rate/etching rate at the location on the surface of the substrate which corresponds to the location of the magnetron is taken to determine if the deposition rate/etching rate was improved by the adjustment made to the power profile of the one or more power supplies. The process is repeated until the deposition rate/etching rate at a location on the surface of the substrate which corresponds to the location of the magnetron reaches an acceptable level. In various embodiments, an acceptable level is defined as a predetermined level of deposition/etching of target material at a location on the surface of the substrate corresponding to a position of the magnetron.

If the initial change in the power profile of the one or more power supplies made the deposition rate/etching rate worse at the location on the surface of the substrate corresponding to the location of the magnetron, a change is made to the power profile of the one or more power supplies in an opposite direction (e.g., opposite polarity) as the previous, initial change. A measurement of the deposition rate/etching rate at the location on the surface of the substrate which corresponds to the location of the magnetron is then measured to determine if the deposition rate/etching rate was improved by the change made to the power profile of the one or more power supplies. The process is repeated until the deposition rate/etching rate at a location on the surface of the substrate which corresponds to the location of the magnetron reaches an acceptable level.

The above described embodiments in accordance with the present principles can be implemented to correct for non-uniform deposition rates/etching rates at locations on a surface of a substrate. For example, in accordance with various embodiments of the present principles, an amount and location of adjustments to be made to set points of a power supply to correct for an area of the substrate having non-uniform deposition or etching may be determined using an iterative process. In one embodiment, a position of the magnetron 119 is tracked by, for example the controller 202, until the magnetron 119 reaches a location on the surface of the substrate having non-uniform deposition or etching of target material. As described above and described in further detail below, a decision is made whether to track a radial and/or angular position of the magnetron 119 dependent upon, for example, a location and/or shape of the non-uniform deposition or etching measured on the surface of a substrate. When the position of the magnetron 119 corresponds to a location on the surface of a substrate having non-uniform processing of target material, the controller 202 communicates a signal to at least one power supply 204 to modulate or control a power profile of the one or more power supplies to cause a change in the deposition rate/etching rate of the target material at the location on the surface of the substrate which corresponds to the location of the magnetron 119.

A measurement of the deposition rate/etching rate at a location on the surface of the substrate which corresponds to the location of the magnetron is taken to determine if the uniformity of the deposition process/etching process was improved by the change made to the power profile of the one or more power supplies 204. If the deposition rate/etching rate was improved to an acceptable level (e.g., a level which will result in uniform deposition/etching of target material at the location on the surface of the substrate), no further change is made to the power profile of the one or more power supplies. In one embodiment of the present principles, an input power set point communicated to the one or more power supplies which resulted in the acceptable deposition rate/etching rate is saved by, for example the controller 202, as a point on a functional curve, such as the curves depicted in FIGS. 6A and 6B, for a corresponding position of the magnetron.

If the initial change in the power profile of the one or more power supplies improved the uniformity of the target material being deposited/etched at the location on the surface of the substrate corresponding to the location of the magnetron, however a determination is made from the deposition rate/etching rate measurement that a greater change needs to be made, a greater change is made to the power profile of the one or more power supplies in the same direction (e.g., polarity) as the previous, initial change. A measurement of the deposition rate/etching rate at the location on the surface of the substrate which corresponds to the location of the magnetron is then measured to determine if the uniformity of the deposition process/etching process was improved by the change made to the power profile of the one or more power supplies. The process is repeated until the deposition rate/etching rate at a location on the surface of the substrate which corresponds to the location of the magnetron reaches an acceptable level.

If the initial change in the power profile of the one or more power supplies reduced the uniformity of the target material being deposited/etched at the location on the surface of the substrate corresponding to the location of the magnetron, a change is made to the power profile of the one or more power supplies in an opposite direction (e.g., opposite polarity) as the previous, initial change. A measurement of the deposition rate/etching rate at the location on the surface of the substrate which corresponds to the location of the magnetron is then measured to determine if the uniformity of the deposition process/etching process was improved by the change made to the power profile of the one or more power supplies. The process is repeated until the deposition rate/etching rate at a location on the surface of the substrate which corresponds to the location of the magnetron reaches an acceptable level.

The above described process may be repeated at other locations on a surface of a substrate which correspond to respective positions of the magnetron to determine power set points of a power profile for one or more power supplies to control a deposition rate/etching rate on a surface of the substrate as described herein. The determined, respective power set points may be saved by, for example the controller 202, as points on a functional curve for corresponding positions of the magnetron. A resulting functional curve from the above described process may comprise a functional curve as illustrated above with respect to FIGS. 6A and 6B.

Figure 7:
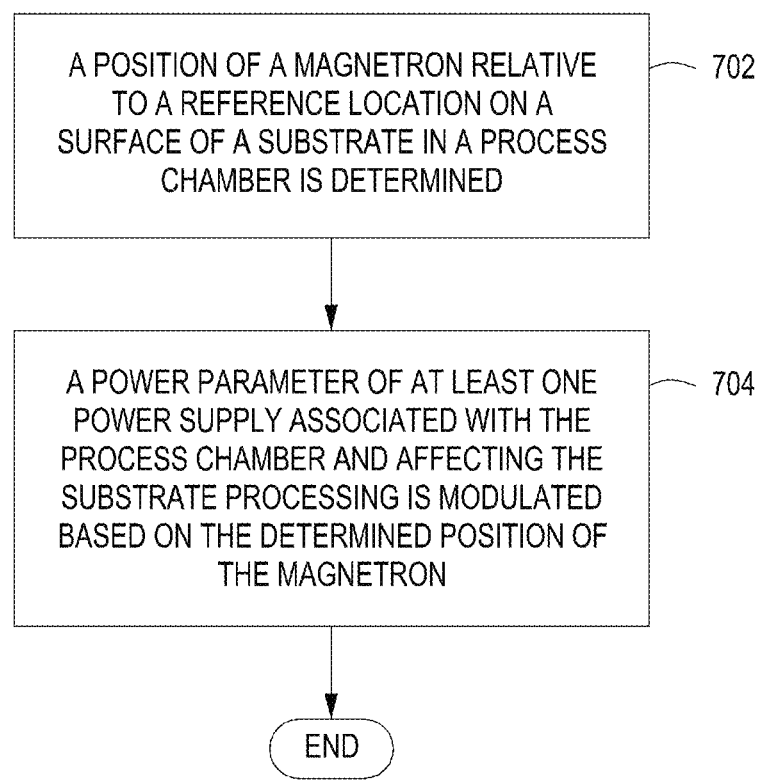
FIG. 7 depicts a flow diagram of a method for controlling substrate processing within a process chamber in accordance with an embodiment of the present principles.

FIG. 7 depicts a flow diagram of a method 700 for controlling substrate processing within a process chamber in accordance with an embodiment of the present principles. The method 700 begins at 702 during which a position of a magnetron relative to a reference location on a surface of the substrate is determined. As described above, in one embodiment in accordance with the present principles, a position of the magnetron relative to a reference location on a surface of the substrate may be determined using positional information communicated to a controller from a positioner of the magnetron, such as the two-axis driver 206 of FIG. 2. The method 700 can then proceed to 704.

At 704, a power parameter of at least one power supply associated with the process chamber and affecting the substrate processing is modulated based on the determined position of the magnetron. In one embodiment in accordance with the present principles, the power parameter can include a power set point of at least one of a direct current (DC) source power, a radio frequency (RF) bias power, a DC shield bias voltage, or an electromagnetic coil current of the at least one power supply. As described above, if the position of the magnetron corresponds to a location on the surface of the substrate at which a change in a deposition rate or etching rate is to be achieved, a power set point of a power supply affecting the substrate processing is modulated to achieve the change in a deposition rate or etching rate at the respective location on the surface of the substrate corresponding to the position of the magnetron. As described above, in one embodiment in accordance with the present principles, a location on the surface of the substrate at which a change in a deposition rate or etching rate is to be made can be identified using a measured deposition rate profile or etching rate profile. The method 700 can then be exited.

In accordance with various embodiments of the present principles, a controller, such as the controller 202 of FIG. 2, may have access to various function types for controlling the operation of the components of the process chamber 100, and specifically the power supplies 204, during various different processes for processing a substrate. In such embodiments, the power set points of power supplies affecting the substrate process may be modulated or controlled according to the accessible function types. In one embodiment in accordance with the present principles, the function types for modulating the power supplies 204 in the manner described herein may be stored in the memory 320 of the controller 202.

For example and as described above in accordance with embodiments of the present principles, a function type (e.g., a functional curve) may be determined for adjusting the set points of one or more power supplies of a deposition process/etching process for adjusting a deposition rate/etching rate on a surface of a substrate being processed based on a position of a magnetron. The function types determined are applicable for respective deposition processes/etching processes having parameters for which the function was determined. If any parameters of the deposition process/etching process are altered (e.g., a change in the process gas, substrate, power supply settings, processing times, etc.), a new function type (e.g., functional curve) for altering the power set points of respective power supplies associated with the new parameters may need to be determined/applied in accordance with the present principles. The various function types may be stored in, for example, the memory 320 of the controller 202 to be recalled by, for example, the controller 202 for application to power supplies of a deposition processes having parameters for which a respective function type was determined.

In alternate embodiments in accordance with the present principles, a DC power coupled to a target is varied by a percentage of set point based upon an angle of the magnetron. For example, if a particular quadrant, or range angle of a substrate being processed is experiencing relatively less deposition and different quadrants or range of angles are experiencing relatively more deposition, the power at those particular angles could be raised or lowered, as a function of the angular position of the magnetron, to correct for the variations in deposition as described above. The foregoing would advantageously reduce material deposition non-uniformity on the substrate.

Embodiments in accordance with the present principles may be implemented to correct for non-uniform deposition on a substrate due to, for example, the shuttering of a deposition process by physical obstacles in a process chamber. For example, fins of a collimator may cause regular shadows or deposition variations on a substrate. In accordance with various embodiments of the present principles, a power setting of a power supply affecting the deposition process, such as the DC power coupled to the target, may be adjusted at respective angles of the magnetron corresponding to those locations on the substrate being shadowed. In such applications, adjusting the power settings at those angles to provide more power where more deposition is required and/or less power where less deposition is required provides a more uniform deposition on the substrate as described above.

In alternate embodiments in accordance with the present principles, a current applied to an electromagnet (e.g., current supplied to first and/or second magnets 194, 196 of FIG. 1) may be controlled/adjusted based upon the angular or radial position of the magnetron to control a deposition rate/etching rate of target material as described above. That is, as the magnetron 119 moves closer to the central axis of the process chamber 100 (and, as such, the substrate support), the effect of the B-field generated by the electromagnets (e.g., magnets 194, 196 of FIG. 1) changes dramatically. Thus, the current of an electromagnet power supply could be controlled as a function of the magnetron angular or radial position to reduce material deposition/etching non-uniformity on the substrate. The processes disclosed herein are not mutually exclusive and may be used in any combination found to be advantageous to substrate processing results.

While the foregoing is directed to embodiments of the present principles, other and further embodiments of the present principles may be devised without departing from the basic scope thereof.

The invention claimed is:

1. A method of controlling processing of a substrate within a process chamber, comprising:
   determining at least an angular position of a magnetron in the process chamber relative to a reference location on a surface of the substrate using positional information of a motor used to position the magnetron; and
   modulating a power parameter of at least one power supply affecting substrate processing based at least on the determined angular position of the magnetron.

2. The method of claim 1, wherein the power parameter comprises a power set point of at least one of a direct current (DC) source power, a radio frequency (RF) bias power, a DC shield bias voltage, or an electromagnetic coil current.

3. The method of claim 2, wherein a power set point of at least one of the direct current (DC) source power, the radio frequency (RF) bias power, the DC shield bias voltage, or the electromagnetic coil current is modulated to increase a deposition of material at a location on the surface of the substrate corresponding to the determined position of the magnetron.

4. The method of claim 2, wherein a power set point of at least one of the direct current (DC) source power, the radio frequency (RF) bias power, the DC shield bias voltage, or the electromagnetic coil current modulated to decrease a deposition of material at a location on the surface of the substrate corresponding to the determined position of the magnetron.

5. The method of claim 1, wherein a power parameter of the at least one power supply is modulated in accordance with a functional curve.

6. The method of claim 5, wherein points on the functional curve are determined based on an amount of change to be made in a deposition rate or an etching rate at respective reference locations on the surface of the substrate.

7. The method of claim 1, wherein the process chamber comprises a physical vapor deposition (PVD) chamber and the modulating controls a rate of material deposition at a location on the surface of the substrate corresponding to the determined position of the magnetron.

8. The method of claim 7, comprising measuring a deposition rate at respective locations on the surface of the substrate to identify at least one location on the surface of the substrate at which to adjust a rate of material deposition via the modulating.

9. The method of claim 7, wherein the modulating controls a uniformity of material deposition across the surface of the substrate.

10. The method of claim 1, wherein the process chamber comprises an etching chamber and the modulating controls a rate of material etching at a location on the surface of the substrate corresponding to the determined position of the magnetron.

11. The method of claim 10, comprising measuring an etch rate at respective locations on the surface of the substrate to identify at least one location on the surface of the substrate at which to adjust a rate of material etching via the modulating.

12. The method of claim 10, wherein the modulating controls a uniformity of material etching across the surface of the substrate.

13. The method according to claim 1, wherein determining the position comprises determining an angular position of the magnetron relative to a central axis of or a reference location on the surface of the substrate.

14. The method of claim 1, wherein the modulating is based on at least one of an angular position of the magnetron with respect to the reference location on the surface of the substrate, or a radial position of the magnetron with respect to the reference location on the surface of the substrate.

15. An apparatus for controlling processing of a substrate within a process chamber including a moveable magnetron and at least one power supply, comprising:
   a processor; and
   a memory coupled to the processor, the memory having stored therein instructions executable by the processor to configure the apparatus to:
      determine at least an angular position of the moveable magnetron relative to a reference location on a surface of the substrate using positional information of a motor used to position the moveable magnetron; and
      modulate a power parameter of the least one power supply based on the determined position of the moveable magnetron.

16. The apparatus of claim 15, wherein the power parameter comprises a power set point of at least one of a direct current (DC) source power, a radio frequency (RF) bias power, a DC shield bias voltage, or an electromagnetic coil current.

17. The apparatus of claim 15, wherein the process chamber comprises a two-axis driver for controlling a movement of the movable magnetron and communicating position information of the moveable magnetron to the apparatus.

18. A substrate processing system, comprising:
   a process chamber, comprising;
      an inner volume;
      a substrate support disposed within the inner volume to support a substrate;
      a target having a front face exposed to the inner volume;
      a movable magnetron disposed proximate a back side of the target opposite the front face and rotatable about a central axis of the substrate support; and
      at least one power supply providing power to the process chamber; and
   a controller comprising a processor and a memory coupled to the processor, the memory having stored therein instructions executable by the processor to configure the controller to:
      determine at least an angular position of the moveable magnetron relative to a reference location on a surface of the substrate mounted on the substrate support using positional information of a motor used to position the moveable magnetron; and
      modulate a power parameter of the at least one power supply based on the determined position of the moveable magnetron.

19. The substrate processing system of claim 18, comprising a two-axis driver for controlling a movement of the moveable magnetron and communicating position information of the moveable magnetron to the controller.

20. The substrate processing system of claim 18, wherein the power parameter comprises a power set point of at least one of a direct current (DC) source power, a radio frequency (RF) bias power, a DC shield bias voltage, or an electromagnetic coil current.

* * * * *